United States Patent
Murao (10) Patent No.: US 7,883,764 B2
(45) Date of Patent: Feb. 8, 2011

(54) FINE RESINOUS STRUCTURE, FABRICATION THEREOF, AND POLYMERIZABLE RESIN-PRECURSOR COMPOSITION

(75) Inventor: Kenji Murao, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 394 days.

(21) Appl. No.: 11/873,024

(22) Filed: Oct. 16, 2007

(65) Prior Publication Data
US 2008/0167396 A1 Jul. 10, 2008

(30) Foreign Application Priority Data
Oct. 16, 2006 (JP) ............................. 2006-281173

(51) Int. Cl.
*B32B 15/00* (2006.01)
*B32B 17/00* (2006.01)
*H01L 21/31* (2006.01)
*C29C 39/00* (2006.01)

(52) U.S. Cl. ....................... 428/209; 428/210; 438/758; 438/778; 264/496; 526/245; 522/187; 522/182

(58) Field of Classification Search ................. 522/182, 522/187; 430/281.1; 526/242–255; 438/758, 438/778; 264/496; 428/209, 210
See application file for complete search history.

(56) References Cited

U.S. PATENT DOCUMENTS

| | | | | |
|---|---|---|---|---|
| 5,405,677 A * | 4/1995 | Griffith et al. | ............... | 428/209 |
| 6,309,580 B1 * | 10/2001 | Chou | ........................ | 264/338 |
| 7,195,733 B2 * | 3/2007 | Rogers et al. | ............... | 264/496 |
| 7,416,991 B2 * | 8/2008 | Bandic et al. | ............... | 438/717 |
| 7,473,650 B2 * | 1/2009 | Rantala et al. | .............. | 438/778 |
| 7,604,836 B2 * | 10/2009 | Guo et al. | .................... | 427/133 |
| 7,648,767 B2 * | 1/2010 | Fu et al. | ..................... | 428/429 |
| 7,677,877 B2 * | 3/2010 | Wuister et al. | ........... | 425/174.4 |
| 2005/0272599 A1 * | 12/2005 | Kramer et al. | .............. | 502/227 |
| 2007/0254481 A1 * | 11/2007 | Kori et al. | ................... | 438/685 |
| 2008/0315459 A1 * | 12/2008 | Zhang et al. | ................ | 264/338 |
| 2009/0011141 A1 * | 1/2009 | Carter et al. | ................ | 427/534 |
| 2009/0028910 A1 * | 1/2009 | DeSimone et al. | .......... | 424/401 |

FOREIGN PATENT DOCUMENTS

| | | |
|---|---|---|
| CN | 1259933 A | 7/2000 |
| JP | 2004-211021 | 7/2004 |
| JP | 2005-074774 | 3/2005 |
| JP | 2006-110997 | 4/2006 |
| WO | WO 98/46556 | 10/1998 |

OTHER PUBLICATIONS

Choi et al, "Fluorinated Organic-Inorganic Hybrid Mold as a New Stamp for Nanoimprint and Soft Lithography", Langmuir 2005, 21, 9390-9392.*
Chinese Office Action of 200710180247.6 dated Oct. 16, 2009 with partial translation.

* cited by examiner

*Primary Examiner*—Susan W Berman
(74) *Attorney, Agent, or Firm*—Antonelli, Terry, Stout & Kraus, LLP.

(57) ABSTRACT

Disclosed is a resinous molded article which has a fine structure of a nanometer level and includes a material containing a polymer of a polymerizable organic fluorocompound. The polymer is formed from, for example, a monomeric precursor composition containing a methacrylate and/or an acrylate in combination with a fluorine-containing photopolymerizable monomeric precursor composition miscible with the former composition.

18 Claims, 3 Drawing Sheets

FINE RESINOUS STRUCTURE, FABRICATION THEREOF, AND POLYMERIZABLE RESIN-PRECURSOR COMPOSITION

CLAIM OF PRIORITY

The present application claims priority from Japanese Application Serial No. 2006-281173, filed on Oct. 16, 2006, the content of which is hereby incorporated by reference into this application.

FIELD OF THE INVENTION

The present invention relates to a resinous molded article having a fine structure of a nanometer level, fabrication thereof, and a polymerizable resin-precursor composition for the fabrication of the resinous molded article. Specifically, it relates to a photocurable resin-precursor composition suitable for use in photonanoimprint, and to photonanoimprinting.

BACKGROUND OF THE INVENTION

Lithographic techniques using light (photolithography) or electron beams (electron beam lithography) have been known for the fabrication of fine structures on the order of several tens of nanometers to several hundreds of nanometers, and a variety of semiconductor devices are fabricated using these techniques.

The former photolithography includes complicated processes of irradiating a surface of a resin film with a reduced pattern of UV (ultraviolet) light corresponding to interconnections, and developing a latent image of the irradiated pattern. The photolithography also has a theoretical or fundamental lower limit of processable dimensions, because there occurs light diffraction, and photolithographic processing with dimensions of 100 nm or less is substantially difficult. On the other hand, the latter electron beam lithography enables processing with dimensions smaller than those in photolithography using UV (ultraviolet) light. However, it takes much time to pattern a large number of substrates, because patterning (imaging) is conducted directly with electron beams. For these reasons, it is difficult to obtain high throughputs according to these known lithographic techniques.

In contrast, a technique of fabricating a fine structure, called "nanoimprinting", has been reported in a variety of documents as a technique yielding a high throughput. According to this technique, a desired convex-concave pattern is formed typically on a silicon substrate or a metal sheet, and the silicon substrate or metal sheet bearing the pattern is pressed to a resinous film which is generally heated to a temperature higher than its glass transition point to transfer the convex-concave pattern of the original to the resinous film to thereby form a corresponding convex-concave pattern, which is reversal to the original pattern, on the resinous film.

Japanese Unexamined Patent Application Publication (JP-A) No. 2004-211021 discloses use of an epoxy resin-precursor composition containing a fluorine-containing compound as a monomeric precursor for epoxy resin, to obtain an optical device excellent in dimensional and optical properties. Japanese Unexamined Patent Application Publication (JP-A) No. 2005-074774 discloses that, to finely process a mold, the mold is subjected to dry etching with fluorine gas to fix fluorine atom on the surface of the mold to thereby impart mold releasability to the mold.

Materials of resinous films for these purposes include, for example, thermoplastic resins such as a poly(methyl methacrylate) (PMMA) and a polystyrene; crosslinked polymers thereof; and thermosetting resins such as a polyimide. Such nanoimprinting yields, for example, patterns having a structure composed of resinous pillars with diameters of several tens of nanometers to several hundreds of nanometers arranged on a substrate, or a structure composed of bumps or grooves.

However, dimensions to be processed are decreased more and more, and, when a polymeric resist film is subjected to processing to form pillars with diameters of several tens of nanometers thereon, the mold should be pressed to the polymeric resist film under a higher pressure, and thereby the surface of mold and a target fine resist pattern structure once formed are likely to be destroyed. In addition, the known nanoimprinting technique should use a resist that is susceptible to deformation, but this causes lack of rigidity of the formed pillars, and such pillars may often fail to maintain their fine dimensions.

In contrast to the nanoimprinting technique using a polymeric film, there is known another imprinting technique using a photopolymerizable monomeric resist-precursor composition. The term "precursor" means that it exhibits an activity as a resist only after photocure. The precursor herein is a composition composed of one or more different photopolymerizable monomers or oligomers.

This process is called photonanoimprinting or step-and-flash imprint lithography. In this process, for example, a liquid resist precursor is added dropwise onto a substrate; a mold is pressed thereto so as to allow the liquid resist precursor to follow a surface convex-concave pattern of the mold; and UV (ultraviolet) light is applied to the resist precursor to photocure the precursor. This process is advantageous in that the pattern on the mold can be easily transferred even when the mold is pressed under a relatively low pressure, because the resist is in the form of a liquid precursor. The photonanoimprinting is further advantageous in that there is no need of using a precise optical system for the application of UV (ultraviolet) light, and an entire patterning process can be constructed at low cost.

In addition, the technique is remarkably advantageous in that dimensions to be processed are resistant to variation depending on the wavelength of UV (ultraviolet) light to be applied, because the shape and dimensions of the resist to be processed are determined by the fine convex-concave pattern previously arranged on the mold. Therefore, the photonanoimprinting is often used for patterning relatively fine structures. When a quartz plate, which is transparent to UV (ultraviolet) light within a broad range of wavelengths, is used as the substrate, the resist precursor can be exposed to UV (ultraviolet) light through the quartz mold. Likewise, when a substrate used is transparent to UV (ultraviolet) light, the resist precursor may be exposed to UV (ultraviolet) light through the substrate.

First of all, the resist precursor for this purpose should be a liquid, as mentioned above. Such a photocurable resist precursor used in photonanoimprint has to be easily spread as a result of pressing of the mold. Accordingly, the resist precursor as a liquid is preferably applied as a liquid film typically by spin coating. The thickness of the liquid film is determined depending on dimensions to be processed, and it is generally from 50 nm to 100 nm in many cases.

SUMMARY OF THE INVENTION

An object of the present invention is to provide a novel fine structure of a nanometer level, a process for the fabrication thereof, and a polymerizable resin composition for use in the process. More specifically, an object of the present invention is to provide a material and a molding process, which do not cause undesirable deformations, breakages, and losses (chippings) of the resulting molded article when the molded article is separated from the mold.

According to an embodiment of the present invention, there is provide a fine resinous molded article which is a fine structure of a nanometer level and includes a material containing a polymer of a polymerizable organic fluorocompound. According to another embodiment of the present invention, there is provided a fine structure including fine structures and a resinous film, in which the fine structures are connected through the resinous film. The term "fine structure of a nanometer level" as used herein refers to a structure having a convex-concave (three-dimensional) structure of a minimum size of several nanometers to one thousand nanometers.

According to still another embodiment of the present invention, there is provided a method of fabricating a fine molded resinous article, which includes the steps of bringing a mold having a fine convex-concave pattern of a nanometer level on its surface into contact with a liquid polymerizable resin composition containing a polymerizable organic fluorocompound and a polymerization initiator to transfer the fine convex-concave pattern to the polymerizable resin composition; carrying out polymerization of the polymerizable resin composition while being kept in contact with the mold to yield a polymerized resinous article; and separating the mold from the polymerized resinous article.

In addition, there is provided, according to another embodiment of the present invention, a polymerizable resin composition for a fine structure of a nanometer level, which includes a polymerizable organic fluorocompound and a polymerization initiator, in which the composition contains substantially no nonpolymerizable substance other than the polymerization initiator, or is free from the non-polymerizable substance other than the polymerization initiator.

According to embodiments of the present invention, there is provided a molded article by nano-imprinting, which is resistant to breakage and deformation upon patterning. In addition, the molded article as a fine structure is prevented from decrease in mold releasability and from defects such as deformation and breakage even when the mold is used repeatedly.

DETAILED DESCRIPTION OF THE PREFERRED EMBODIMENTS

When a regular liquid organic substance is spread to form a film of a small thickness on a substrate such as glass typically by spin coating, the film generally immediately shrinks to yield a shrunk film or fine droplets when the spinning is stopped.

To form a thin film of, for example, a photoresist on a substrate typically by spin coating, the photoresist is often applied as a solution in a solvent. In this case, the resulting film is free from shrinkage, because the solvent begins evaporating and the liquid film becomes a semi-solid film immediately after spin coating. However, it is not desirable to use a liquid that exhibits volatility at relatively low temperatures in photonanoimprinting, because a residual solvent in trace amount may volatile upon transfer to thereby seriously adversely affect the formation of a fine convex-concave pattern. Accordingly, it is undesirable to form a thin film of a polymerizable resist precursor by using a solution of the polymerizable resist precursor in a solvent.

Taking radical polymerization as an example, a photoinitiator yields an active species as a result of photo-irradiation, the active species gives a radical on an unsaturated bonding site, and the radical triggers a photocure reaction. The radical polymerization reaction is generally carried out under reduced pressure and/or in an inert gas atmosphere, because oxygen molecules, if present, adversely affect smooth propagation of a reaction active center.

When the photocure reaction is another polymerization reaction than radical polymerization as above, such as cation polymerization, the system does not always require reduced pressure and subsequent replacement with an inert gas, because an adverse effect of the presence of oxygen molecules is not so large. In this case, the requirement that components constituting the resist-precursor composition have low volatilities is somewhat smaller as compared with that in radical polymerization. When cation polymerization is selected as the reaction mode, the polymerizable substance for use therein includes not only a compound having an unsaturated bond but also an epoxy compound and other polymerizable compounds. However, even according to cation polymerization, a trace amount of solvent inevitably remains when a fine structure of resist is formed, and this often causes a critical defect.

Even exhibiting substantially no volatility at low temperatures, if a nonpolymerizable substance that is not involved in a photocure reaction is present in a substantial concentration in the resist precursor composition, the resulting fine structure after photocure lacks rigidity, and the fine convex-concave structure is susceptible to collapse, because the component is not involved in the photocure reaction. Accordingly, an object of the present invention is to solve this problem.

A coating solution of a photoresist for spin coating often contains a surfactant to lower the surface tension of the coating solution. If such a surfactant is added to the solvent-free liquid photocurable resist precursor, a liquid film formed therefrom is easy to spread in early stages, but it often shrinks after spin coating, because the surfactant firmly adheres to the surface of the substrate, and the surface of the substrate has lower energy.

Even when a liquid film of a resist precursor for photonanoimprint is formed by another process than spin coating, it is important that the resist precursor is capable of easily forming a liquid film. A representative example of the process other than spin coating is an ink-jet process. In this process, a liquid resist precursor is applied as a droplet onto a substrate according to the ink-jet process and is spread by pressing a mold thereto. There is a significant correlation between the spreadability of the liquid in the ink-jet process and the formability of a liquid film by spin coating.

As has been described above, it is desirable to provide a photocurable liquid resist precursor that is suitably used in photonanoimprint, and, specifically, to provide a photocurable liquid resist precursor having a high coating performance to a substrate and good photocurability. As more specific conditions, it is preferred, for example, that the photocurable liquid resist precursor does not contain an adsorptive surfactant that is adsorptive to a substrate; it does not contain a solvent that is not involved in polymerization or a component showing high volatility at room temperature even under a reduced pressure; it does not contain a substantial concentration of another additive that is not photocurable; and it has such a composition as to exhibit sufficient wettability to the substrate to thereby ensure good coating performance. The wettability is important, because it is significantly associated with how the liquid resist precursor follows a fine convex-concave pattern on a surface of the mold when the mold is pressed to the liquid resist precursor. These properties enable the liquid resist precursor to form a fine pattern upon photo-irradiation.

Specifically, it is desirable to enable a photocured resist to be easily released from a mold without damaging a fine convex-concave pattern formed on the surface of the resist. In the field of photonanoimprint to which the present invention relates, for example, a monomolecular film of a perfluorocompound as a mold releasing agent is often arranged on the surface of the mold for easy mold release. This technique, however, is not always effective when the mold has fine pores of 30 nm or less in diameter on its surface. This is because of an essential problem in that the perfluoroalkyl compound often has a structure of a long-chain alkyl or an alkylene glycol condensate polymer and thereby is difficult to diffuse or spread into pores of the fine structures. In other words, this is because the molecular size of such a long-chain alkyl group or an alkylene glycol condensate polymer is not sufficiently small as compared with the diameters of pores on the surface of the mold. This problem becomes more and more serious with an increasing fineness of the pattern on the surface of the mold.

Consequently, inner surfaces of pores of the mold do not undergo sufficient mold release treatment. When this mold is released after photo-irradiation of a monomeric resist-precursor composition, tips of the resist penetrating pores of the mold firmly adhere to the inner surfaces of pores of the mold, resulting in shearing of the resist film. The shape of the resist film is often not in the exact accordance with the shape of the mold. This problem is essentially because it is difficult to apply a mold release treatment to fine patterns typified by inner surfaces of fine concaves such as pores. It is firmly indicated that another countermeasure than the mold release treatment is required to solve this problem. Even if a large amount of a mold releasing agent can be forcedly injected into fine pores of the mold, this injection operation causes deformation of the fine pores with diameters of, for example, about 50 nm. The fine pillars of the resulting resist pattern thereby deform. Therefore, this technique cannot be a solution to the problem. At least, it is apparently difficult to solve the entire problem of attachment of the cured resist to the mold by such a mold release treatment alone.

Accordingly, the organic fluorocompound for use in the present invention is preferably one having a fluorine-containing repeating unit. The organic fluorocompound is desirably a photopolymerizable monomer. In addition, the organic fluorocompound preferably has a photopolymerizable acrylic ester moiety or methacrylic ester moiety, or both.

The polymerizable organic fluorocompound is preferably at least one selected from the group consisting of photopolymerizable organic fluorocompounds represented by following Formula (1) to Formula (3).

Formula (1)

wherein $R_1$ and $R_2$ each independently represent an alkyl group, a phenyl group, or an aralkyl group, each of which has at least one polymerizable unsaturated bond; and "n" denotes an integer of from 1 to 10, Formula (2)

wherein $R_3$ and $R_4$ each independently represent an alkyl group, a phenyl group, or an aralkyl group, each of which has at least one polymerizable unsaturated bond; and "n" denotes an integer of from 1 to 10, and Formula (3)

wherein $R_5$ and $R_6$ each independently represent an alkyl group, a phenyl group, or an aralkyl group, each of which has at least one polymerizable unsaturated bond; and $X_1, X_2, X_3$, and $X_4$ each independently represent hydrogen (H) or fluorine (F).

The molded article is preferably a photopolymerized product of a resin-precursor composition containing 0.1 percent by weight or more, more preferably 0.5 to 20 percent by weight, and further preferably 1 to 10 percent by weight, of at least one of the photopolymerizable organic fluorocompounds of Formulae (1) to (3). The remainder contains, for example, an unsaturated ester compound such as a methacrylic ester compound or an acrylic ester compound, or another compound having a vinyl group. The organic fluorocompound can have an epoxy moiety that undergoes polymerization initiation by the action of a photoinitiator.

After intensive investigations to provide countermeasures to solve the problems that adversely affect the transfer of a fine shaped pattern, the present inventors found an effective process for solving these problems, in which a photopolymerizable composition containing a regular component for photopolymerizable composition and, in addition, a photopolymerizable compound having an organic group substituted with fluorine atom is used as a resist-precursor composition in photonanoimprint.

The regular component for photopolymerizable composition herein includes an unsaturated ester compound such as a methacrylic ester compound and an acrylic ester compound; and another compound having a vinyl group. The photopolymerizable compound having an organic group substituted with fluorine atom causes copolymerization with another monomeric precursor in the system as the composition as a result of photo-irradiation. Thus, the monomeric precursor substituted with fluorine atom is firmly taken into the matrix of a solid resist by the action of photopolymerization reaction.

When a variety of fluorine-containing photopolymerizable compounds was prepared and admixed with a composition of a fluorine-free photopolymerizable liquid resist monomer as a base, it was found that most of the fluorine-containing photopolymerizable compounds undergo phase separation and fail to form a homogenous mixed phase. If such a monomeric precursor composition undergone phase separation is used in photonanoimprint, the phase separation prevents the formation of a fine structure. It is well known that regular fluorocompounds generally do not form a homogenous phase with fluorine-free compounds as above, although they have good miscibility with other fluorocompounds.

However, after investigations on a wide variety of fluorocompounds, the present inventors found that most of compounds of Formula (1) have good miscibility with a base composition to form a homogenous phase when substituents $R_1$ and $R_2$ have identical or similar structures to those of polymerizable substituents in a photopolymerizable monomeric precursor composition used as the base. When the base monomeric resist precursor mainly contains, for example, an acrylic ester moiety, a compound of Formula (1) in which substituents $R_1$ and $R_2$ contain an acrylic ester moiety and/or a methacrylic ester moiety is effectively used.

The present inventors further found that this is also true for substituents $R_3$ and $R_4$ in Formula (2), and substituents $R_5$ and $R_6$ in Formula (3). Specifically, they found that a fluorocompound, which is generally immiscible with a regular organic compound, can form a homogenous phase within a broad range of proportion by allowing the fluorocompound to have this structure.

Preferred examples of fluorocompounds of Formula (1) for use in the present invention include 2,2,3,3,4,4-hexafluoro-1,5-pentyl dimethacrylate, 2,2,3,3,4,4-hexafluoro-1,5-pentyl diacrylate, 2,2,3,3,4,4,5,5-octafluoro-1,6-hexyl dimethacrylate, and 2,2,3,3,4,4,5,5-octafluoro-1,6-hexyl diacrylate.

Preferred examples of fluorocompounds of Formula (2) include 2,3,5,6-tetrafluoro-p-xylene-α-α'-diol diacrylate, 2,3,5,6-tetrafluoro-p-xylene-α-α'-diol dimethacrylate, 1,4-bis(acryloxyethoxy)-2,3,5,6-tetrafluorobenzene, and 1,4-bis(methacryloxyethoxy)-2,3,5,6-tetrafluorobenzene.

Preferred examples of fluorocompounds of Formula (3) include 1,4-bis(acryloxyethoxy)perfluorocyclohexylene, 1,4-bis(methacryloxyethoxy)perfluorocyclohexylene, 1,4-perfluorocyclohexylenebisphenol diacrylate, and 1,4-perfluorocyclohexylenebisphenol dimethacrylate.

It was found that a very stable, thin liquid film is formed by dropping and spin-coating a photopolymerizable resist-precursor composition further containing a photopolymerizable fluorocompound onto a substrate. The stability of the liquid film is associated with a very small contact angle of the resist-precursor composition on the substrate, and the small contact angle is caused by the fluorocompound added to the resist-precursor composition. The small contact angle is an evidence of very good wettability with the substrate, and a very stable liquid film can be formed merely by applying centrifugal force through spinning. In addition, the stability of the liquid film is also induced by the selection of a compound that does not firmly anchor to the substrate. By a process according to an embodiment of the present invention, a liquid resist precursor containing no volatile solvent can be satisfactorily formed into a liquid film on a substrate.

A fluorine-containing photopolymerizable compound for use in the present invention is preferably free from such a substituent as to be firmly adsorptive to the substrate. A representative example of the adsorptive substituent is hydroxyl group. When a molecule having a highly adsorptive substituent, such as hydroxyl group, to the substrate contains fluorine atom, the surface of the substrate has extremely low energy, is susceptible to phase separation at the interface with another liquid component that does not contain fluorine atom, and the resulting liquid film is liable to be unstable. However, the use of an additive having an adsorptive substituent such as hydroxyl group is within the scope of the present invention.

It is also very important that the fluorocompound to be added has at least one photopolymerizable unsaturated group such as an acrylic ester moiety or a methacrylic ester moiety. This becomes more significant when a fine convex pattern formed by photonanoimprinting has dimensions of 20 nm in diameter, 30 nm in diameter, or less. In these regions, if the composition contains a component that does not contribute to photocure, the component causes a serious structural defect in the fine structure, and the convex pattern thereby lacks rigidity. This is unsatisfactory as a pattering technique.

When a photoinitiator is added to and dissolved in a monomeric resist-precursor composition prepared according to a process of the present invention and the resulting mixture is applied as a liquid film, the liquid film can be cured by the application of UV (ultraviolet) light. Examples of the photoinitiator for use herein include Irgacure-907 produced by Ciba Specialty Chemicals, Inc.; as well as Irgacure-379, Irgacure-OXE01, Irgacure-651, and Darocur-TPO produced by Ciba Specialty Chemicals, Inc.

The monomer composition of the monomeric resist-precursor composition should be determined in consideration typically of a cross-link density required after photocure. For example, if a monomer having a monofunctional polymerization site is used alone, a linear polymer alone is mainly formed as a result of photopolymerization. If fine or thin pillars are formed using this linear polymer, the pillars lack rigidity, and the fine structure after processing is difficult to maintain their dimensions. In contrast, if the composition contains a monomer having a bifunctional or higher order polymerization site alone, the resulting polymer has an excessively high cross-link density, and the fine structure is weak against impact. Accordingly, it is important that the composition contains a monomer having a monofunctional polymerization site in combination with another monomer having a bifunctional polymerization site in suitable proportions so as to yield a fine structure having satisfactory rigidity together with suitable flexibility.

The light to be applied to cure the liquid resist is often UV (ultraviolet) light typically having a wavelength of 365 nm which is highly reactive and is easily available. Light with such a wavelength as to be easily available from, for example, an ultrahigh-pressure mercury lamp can be used in photonanoimprinting, because the wavelength of light used for curing does not directly affect the minimum dimensions of the pattern to be formed in photonanoimprinting, as described above. The wavelength of light to be applied for curing the liquid resist precursor is not specifically limited, as long as it is within the scope of the present invention. For example, there is not always need of using UV (ultraviolet) light when resist monomers to be used have sufficient reactivity in the visible wavelength region.

When a mold to form a fine convex-concave pattern is pressed onto a liquid resist composition according to an embodiment of the present invention, advantages according to the embodiment of the present invention may be exhibited even when the liquid resist composition is spread not overall the substrate by spin coating. The liquid resist composition according to an embodiment of the present invention contains a monomer component with fluorine atom replacing part or all of hydrogen atoms. Even if the liquid resist composition is merely dropped as a droplet onto the substrate, the droplet easily spreads when the mold is pressed thereto, and the spread droplet follows the fine convex-concave pattern on the mold in an exact manner. This property also significantly features the liquid resist composition according to an embodiment of the present invention and is derived from very low surface tension of the liquid composition.

Another object of the present invention is to provide satisfactory mold releasability. The present inventors used the fluorine-containing monomeric resist precursor as a component of a resist-precursor composition and found that a resist cured by photo-irradiation exhibits remarkable mold releasability. This means that a mold releasing action can be very effectively applied even on inner surfaces of fine pores, to which the mold release treatment with a mold releasing agent is not always effective. Specifically, by imparting mold releasability to a resist itself according to an embodiment of the present invention, the mold releasability can be imparted to the entire surface of the mold with which the resist is in contact, regardless of the shape and dimensions of the mold. Thus, this configuration is apparently very effective.

A key advantage of the process according to an embodiment of the present invention is that a regular mold release treatment can be employed in combination with the process without any problem. If excessive mold releasability is imparted to a resist, the resist becomes easily separable not only from the mold but also from the substrate. The mold releasability to be imparted to the resist should be set at a suitable level. It is therefore effective to carry out the release treatment of the mold with a known mold releasing agent in combination, for supplementing the releasability of the resist from the mold. In this case, the mold releasability previously imparted to the resist itself exhibits its activity mainly in inner surfaces of fine pores, as described above.

According to an embodiment of the present invention, a fluorine-containing polymerizable photocurable monomeric resist precursor is mixed with and dissolved in a liquid fluorine-free photocurable monomeric resist precursor to yield a composition. This composition has improved spreadability to the substrate to thereby yield a stable liquid film. The liquid film easy follows a fine convex-concave pattern on a mold when the mold is pressed to the liquid film. Thus, a fine solid having a pattern in exact accordance with the pattern on the mold surface can be obtained after the application of UV (ultraviolet) light.

The use of the fluorine-containing polymerizable photocurable monomeric resist-precursor composition according to an embodiment of the present invention further adds another effective advantage, i.e., easy release from the mold. This reflects that a fluorine-containing component is likely to concentrate at an interface, which is an advantage essentially involved in an embodiment of the present invention. It should be noted that, even when such a fluorine-containing component concentrates at the surface (interface), the fluorine-containing component is copolymerized with other monomer components in the composition and does not constitute a separated phase.

Figure 1A:
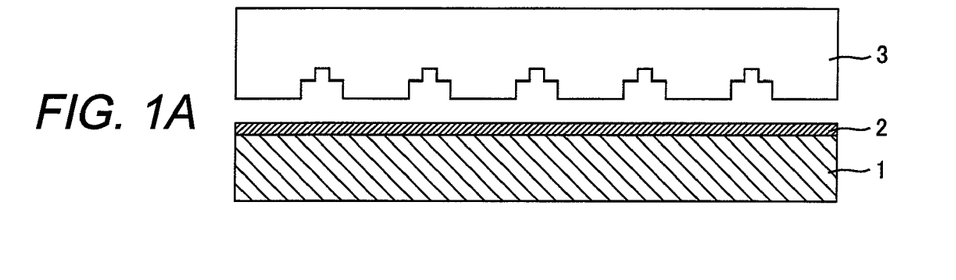
FIGS. 1A, 1B, 1C, and 1D are flow charts sequentially illustrating a process in which a liquid photocurable resist-precursor composition is applied to a substrate by spin coating and a fine pattern is formed thereon by photo-nano-imprinting.
Figure 1B:
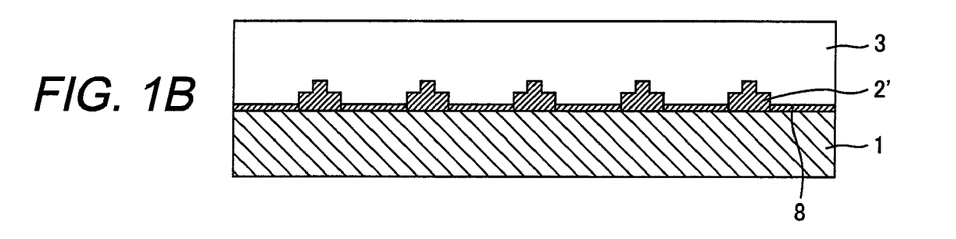

A process according to an embodiment of the present invention for forming a fine pattern using a photopolymerizable resist-precursor composition containing a photopolymerizable fluorocompound dissolved therein will be illustrated with reference to the drawings. With reference to FIG. 1A, a liquid film 2 of a photopolymerizable resist-precursor composition is formed on a substrate 1 by spin coating. With reference to FIG. 1B, a mold 3 having a fine convex-concave pattern on its surface is pressed to the liquid film 2, and the liquid film 2 (liquid resist precursor 2) is patterned to form fine projections 2' in accordance with the pattern on the mold 3. The fine projections 2' are connected through a thin resinous film 8. This is also true for FIG. 3.

Figure 1C:
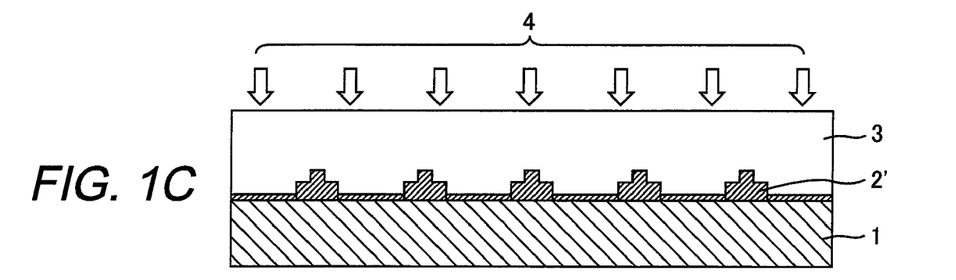
Figure 1D:
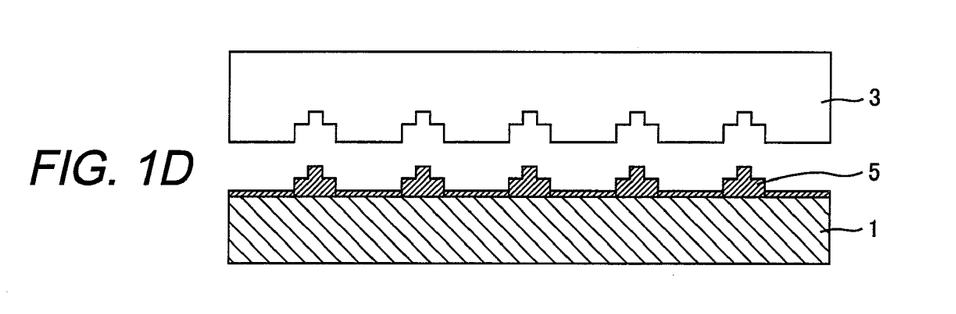

FIG. 1C illustrate show UV (ultraviolet) light 4 is applied through the mold 3 which is transparent to the UV (ultraviolet) light to be applied. UV (ultraviolet) light irradiation through the mold is possible because a quartz mold that is substantially transparent to the UV (ultraviolet) light is used as the mold herein. FIG. 1D illustrates that the resist film is cured and solidified by the application of UV (ultraviolet) light to form a cured pattern 5, and the mold 3 is separated from the surface (the cured pattern 5) of the substrate 1.

In the step shown in FIG. 1A, it is very important for carrying out a photonanoimprint step by coating that the liquid film 2 arranged on the substrate 1 keeps residing stably. It is difficult to carry out the subsequent transfer step if the liquid film 2 does not substantially spread over the substrate 1 or shrinks within a short time. The formability of a liquid film and the stability of the formed liquid film deeply concern with the spreadability of the liquid monomeric resist precursor which is also required in a so-called dispensing technique in which a droplet of the composition is directly dropped to the substrate, and the mold is pressed onto the droplet.

The release of the mold 3 in the step of FIG. 1D becomes very easy by using the monomeric resist-precursor composition according to an embodiment of the present invention. This is a key feature of an embodiment of the present invention using a fluorine-containing resist component. This reduces the adhesive force of the cured resist to the mold, and the mold can thereby be removed or separated with a less peeling force. The reduction of adhesive force of the cured resist is very important, because, if the adhesion of cured resist occurs in a fine resist structure such as a pillar, the fine resist structure may be destroyed when the mold is separated.

FIGS. 2A, 2B, 2C, and 2D sequentially illustrate a process according to a dispensing technique, in which a droplet 6 of a monomeric resist precursor is dropped onto a substrate 1, a mold 3 is pressed thereto, and photo-irradiation 4 is carried out to yield a cured resist pattern 5.

Figure 2A:
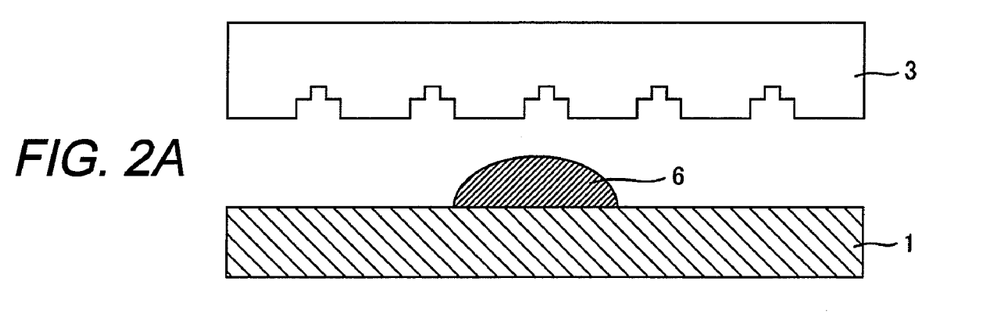
FIGS. 2A, 2B, 2C, and 2D are flow charts sequentially illustrating a process in which a liquid photocurable resist-precursor composition is dropped onto a substrate and a fine pattern is formed thereon by photonanoimprinting.
Figure 2B:
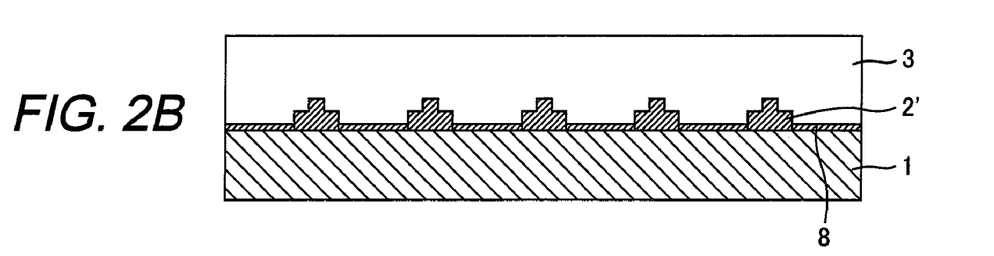
Figure 2C:
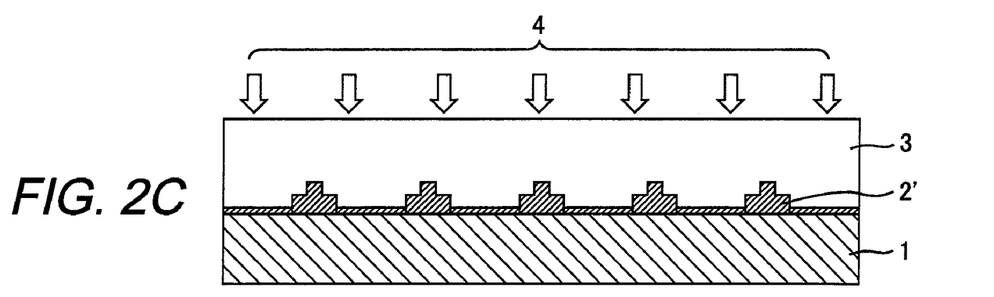
Figure 2D:
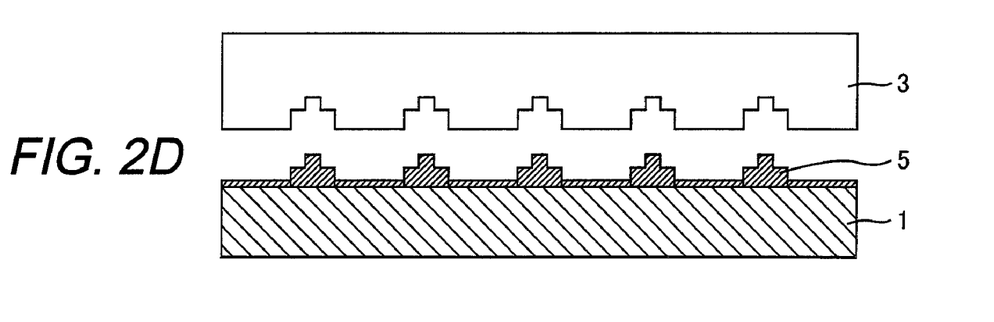
Figure 3:
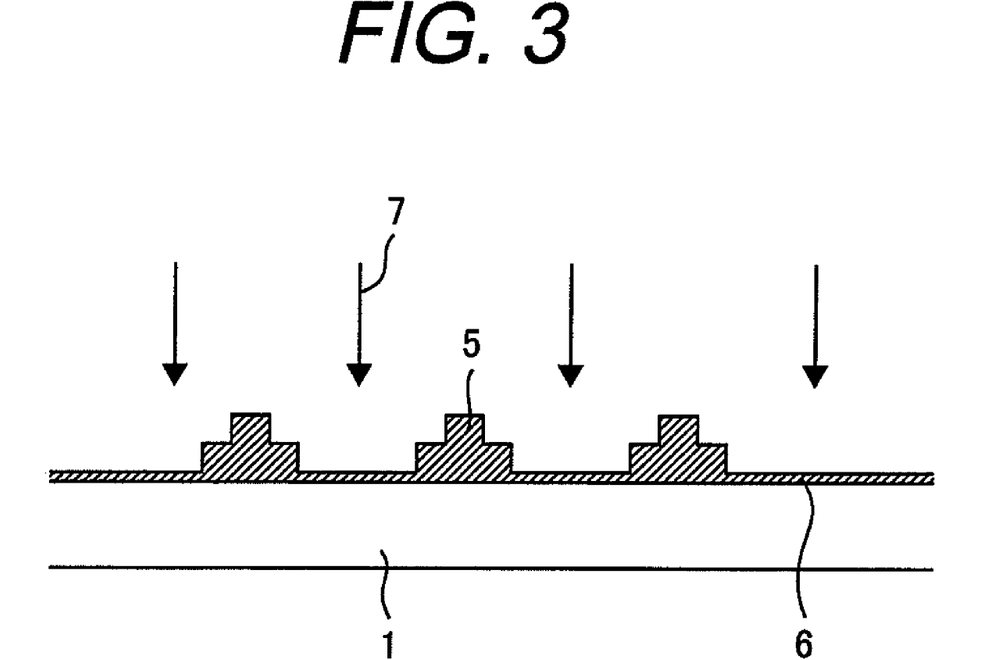
FIG. 3 is a schematic diagram illustrating how etching is conducted using the formed fine pattern.

After the completion of patterning by nanoimprinting as illustrated in FIG. 1D or FIG. 2D, the thin resinous film 6 connecting the fine projections 5 is removed by an etching gas flow 7 (FIG. 3). The thin resinous film is very thin and can thereby be easily removed by etching. Thus, the fine projections can be separated. By further carrying out etching, portions of the substrate 1 between respective fine projections are etched to form a predetermined pattern. In this step, the fine projections as a resist pattern are also etched. However, parameters or conditions such as etching gas, etching conditions, material for the substrate, and resin material for the fine projections should be selected so that the etching rate of the substrate is higher than the etching rate of the fine projections. Finally, the residual fine projections are removed from the substrate, to yield a substrate having a predetermined pattern.

An embodiment has been illustrated in which a fine projection pattern is used as a thin resinous film. In another embodiment, a fine projection pattern connected via a thin resin film is used as intact. In this case, an etching step is not necessary.

The present invention will be illustrated in further detail with reference to examples. It should be noted, however, these examples are never construed to limit the scope of the present invention.

EXAMPLE 1

There was stirred a mixture containing 10 parts by weight of a dimethacrylate having a bisphenol-A skeleton (a product of SHIN-NAKAMURA CHEMICAL CO., LTD. under the trade name of NK Ester BPE-500), 27 parts by weight of tripropylene glycol dimethacrylate (a product of SHIN-NAKAMURA CHEMICAL CO., LTD. under the trade name of NK Ester 3PG), 3 parts by weight of 2,2,3,3,4,4-hexafluoro-1,5-pentyl dimethacrylate (a product of SynQuest Laboratories, Inc.), and 60 parts by weight of benzyl methacrylate (a product of Kyoeisha Chemical Co., Ltd. under the trade name of Light Ester BZ). To the stirred mixture was added 5 percent by weight of 2-methyl-1-(4-methylthiophenyl)-2-morpholinopropan-1-one (a product of Ciba Specialty Chemicals, Inc. under the trade name of Irgacure-907).

The mixture was stirred sufficiently for two hours, filtrated through a filter with a pore size of 50 nm, and thereby yielded a photocurable monomeric resist-precursor composition. Next, the composition was applied to a glass substrate (5.1 cm long, 5.1 cm wide) by spin coating at 5000 rpm, which glass substrate had been washed with a mixture of sulfuric acid and hydrogen peroxide. Thus, a highly homogenous coated film was formed on the entire surface of the substrate. The coated film on the substrate was placed in a space enclosed by quartz glass; the pressure was reduced to 270 Pa; a mold was pressed to the film; and light with a wavelength of 365 nm was applied at 800 mJ/cm$^2$ through the mold to the film using a 500-W ultrahigh-pressure mercury lamp. The mold had been subjected to release treatment on its surface with Optool DSX (Daikin Industries, Ltd.).

After the light application, the mold was separated, and the shape of a cured resist on the substrate was observed with an atomic force microscope (AFM), to find that pillars corresponding to the pattern of the mold with a minimum pore size of 25 nm and a height of 50 nm were precisely formed without defects.

EXAMPLE 2

A mixture of 12 parts by weight of an acrylate having a bisphenol-A skeleton (a product of SHIN-NAKAMURA CHEMICAL CO., LTD. under the trade name of NK Ester A-BPE-10), 23 parts by weight of neopentyl glycol diacrylate (a product of SHIN-NAKAMURA CHEMICAL CO., LTD. under the trade name of NK Ester A-NPG), 5 parts by weight of 2,2,3,3,4,4,5,5-octafluoro-1,6-hexyl diacrylate (a product of SynQuest Laboratories, Inc.), and 60 parts by weight of phenoxyethylene glycol acrylate (a product of SHIN-NAKAMURA CHEMICAL CO., LTD. under the trade name of NK Ester AMP-10G) was stirred. To the stirred mixture was added 5 percent by weight of 2-methyl-1-(4-methylthiophenyl)-2-morpholinopropan-1-one (a product of Ciba Specialty Chemicals, Inc. under the trade name of Irgacure-907).

The mixture was stirred sufficiently for two hours, filtrated through a filter with a pore size of 50 nm, and thereby yielded a photocurable monomeric resist-precursor composition. Next, the composition was applied to a glass substrate (5.1 cm long, 5.1 cm wide) by spin coating at 5000 rpm, which glass substrate had been washed with a mixture of sulfuric acid and hydrogen peroxide. Thus, a highly homogenous coated film was formed on the entire surface of the substrate. The coated film on the substrate was placed in a space enclosed by quartz glass; the pressure was reduced to 270 Pa; a mold was pressed to the film; and light with a wavelength of 365 nm was applied at 80 mJ/cm$^2$ through the mold to the film using a 500-W ultrahigh-pressure mercury lamp. The mold had been subjected to release treatment on its surface with Optool DSX (Daikin Industries, Ltd.). After the light application, the surface of a cured resist on the substrate was observed with an atomic force microscope (AFM) in the same manner as in Example 1, to find that pillars corresponding to the pattern of the mold with a minimum pore size of 25 nm and a height of 50 nm were precisely formed without defects.

EXAMPLE 3

A mixture of 12 parts by weight of a dimethacrylate (a product of SHIN-NAKAMURA CHEMICAL CO., LTD. under the trade name of NK Ester BPE-500), 30 parts by weight of ethyleneglycol dimethacrylate (a product of SHIN-NAKAMURA CHEMICAL CO., LTD. under the trade name of NK Ester 1G), 4 parts by weight of 2,2,3,3,4,4,5,5-octafluoro-1,6-hexyl dimethacrylate, and 60 parts by weight of benzyl methacrylate (a product of Kyoeisha Chemical Co., Ltd. under the trade name of Light Ester BZ) was stirred. To the stirred mixture was added 5 percent by weight of 2-methyl-1-(4-methylthiophenyl)-2-morpholinopropan-1-one (a product of Ciba Specialty Chemicals, Inc. under the trade name of Irgacure-907). The mixture was stirred sufficiently for two hours, filtrated through a filter with a pore size of 50 nm, and thereby yielded a photocurable monomeric resist-precursor composition. The composition was dropped onto a glass substrate (5.1 cm long, 5.1 cm wide) which had been washed with a mixture of sulfuric acid and hydrogen peroxide, a mold identical to that used in Example 2 was pressed thereto, and light was applied through the mold using an ultrahigh-pressure mercury lamp. The mold had been subjected to release treatment on its surface with Optool DSX (Daikin Industries, Ltd.), as in Example 2. After the UV (ultraviolet) light irradiation at 860 mJ/cm$^2$, the mold was separated. Pillars composed of a cured resist with a diameter of 25 nm and a height of 50 nm on the substrate were observed with an atomic force microscope (AFM). The observation demonstrates that 99% or more of the pillars were formed normally.

COMPARATIVE EXAMPLE 1

A photocurable monomeric resist-precursor composition was prepared by the procedure of Example 2, except for not using 2,2,3,3,4,4,5,5-octafluoro-1,6-hexyl diacrylate (SynQuest Laboratories, Inc.). Next, the composition was applied to a glass substrate by spin coating at 5000 rpm by the procedure of Example 2. As a result, a liquid film was formed only in an area about one-thirds of the entire surface of the substrate.

COMPARATIVE EXAMPLE 2

A photocurable monomeric resist-precursor composition was prepared by the procedure of Example 2, except for not using 2,2,3,3,4,4,5,5-octafluoro-1,6-hexyl diacrylate (SynQuest Laboratories, Inc.). Next, the composition was dropped onto a glass substrate (5.1 cm long, 5.1 cm wide), the pressure was reduced to 270 Pa, a mold identical to that used in Example 2 was pressed thereto, and UV (ultraviolet) light was applied using an pressure-pressure mercury lamp. The mold had been subjected to release treatment on its surface with Optool DSX (Daikin Industries, Ltd.), as in Example 2. After the light irradiation at 80 mJ/cm², the mold was separated. Pillars of a cured resist with a diameter of 25 nm and a height of 50 nm on the substrate was observed with an atomic force microscope (AFM). The observation demonstrates that chipping or loss of an entire pillar was observed in about 58% of the pillars, in addition to pillars in which the convex-concave pattern of the mold had been normally transferred.

According to an embodiment of the present invention, there is provided a monomeric resist precursor component that contributes, as a monomeric precursor component, to the formation of a liquid film on a substrate, and causes photo-copolymerization with another monomeric resist precursor upon photo-irradiation to thereby enable the formation of a fine pattern.

It should be understood by those skilled in the art that various modifications, combination, sub-combinations, and alternations may occur depending on design requirements and other factors insofar as they are within the scope of the appended claims or the equivalents thereof.

What is claimed is:

1. A fine resinous molded article comprising a fine structure of a nanometer level made of a material containing a polymer of at least one polymerizable organic fluorocompound selected from the group consisting of photo-polymerizable organic fluorocompounds represented by following Formulae (1) to (3):

Formula (1)

wherein $R_1$ and $R_2$ each independently represent an ethoxy group, an alkyl group, a phenyl group, or an aralkyl group, each of which has at least one polymerizable unsaturated bond; and "n" denotes an integer of from 1 to 10, Formula (2)

wherein $R_3$ and $R_4$ each independently represent an ethoxy group, an alkyl group, a phenyl group, or an aralkyl group, each of which has at least one polymerizable unsaturated bond; and "n" denotes an integer of from 1 to 10, and Formula (3)

wherein $R_5$ and $R_6$ each independently represent an ethoxy group, an alkyl group, a phenyl group, or an aralkyl group, each of which has at least one polymerizable unsaturated bond; and $X_1$, $X_2$, $X_3$, and $X_4$ each independently represent hydrogen (H) or fluorine (F).

2. The fine resinous molded article of claim 1, wherein $R_1$ and $R_2$ each independently represent an alkyl group, a phenyl group, or an aralkyl group, each of which has at least one polymerizable unsaturated bond.

3. The fine resinous molded article of claim 2, further comprising a substrate, wherein the fine structure is provided on the substrate.

4. The fine resinous molded article of claim 2, wherein material of which the fine structure is made further contains an unsaturated ester compound.

5. The fine resinous molded article of claim 2, wherein material of which the fine structure is made further contains a compound having a vinyl group.

6. The fine resinous molded article of claim 2, wherein the at least one polymerizable organic fluorocompound is selected from the group consisting of 2,2,3,3,4,4-hexafluoro-1,5-pentyl dimethacrylate, 2,2,3,3,4,4-hexafluoro-1,5-pentyl diacrylate, 2,2,3,3,4,4,5,5-octafluoro-1,6-hexyl dimethacrylate, 2,2,3,3,4,4,5,5-octafluoro-1,6-hexyl diacrylate, 2,3,5,6-tetrafluoro-p-xylene-α-α'-diol diacrylate, 2,3,5,6-tetrafluoro-p-xylene-α-α'-diol dimethacrylate, 1,4-bis(acryloxyethoxy)-2,3,5,6-tetrafluorobenzene, 1,4-bis(methacryloxyethoxy)-2,3,5,6-tetrafluorobenzene, 1,4-bis(acryloxyethoxy)perfluorocyclohexylene, 1,4-bis(methacryloxyethoxy)perfluorocyclohexylene, 1,4-perfluorocyclohexylenebisphenol diacrylate, and 1,4-perfluorocyclohexylenebisphenol dimethacrylate.

7. The fine resinous molded article of claim 2, wherein the molded article is a photopolymerized product of a resin-precursor composition comprising 0.1 percent by weight or more of at least one of the photopolymerizable organic fluorocompounds of Formulae (1) to (3).

8. The fine resinous molded article of claim 2, wherein the organic fluorocompound comprises 0.5 to 20 percent by weight of the molded article.

9. The fine resinous molded article of claim 2, wherein the organic fluorocompound comprises 1 to 10 percent by weight of the molded article.

10. A fine resinous molded article, comprising fine structures of a nanometer level and a resinous film connecting the fine structures, wherein the fine structures and the resinous film are made from a material containing a polymer of at least one polymerizable organic fluorocompound selected from the group consisting of photopolymerizable organic fluorocompounds represented by following Formulae (1) to (3):

Formula (1)

wherein $R_1$ and $R_2$ each independently represent an ethoxy group, an alkyl group, a phenyl group, or an aralkyl group, each of which has at least one polymerizable unsaturated bond; and "n" denotes an integer of from 1 to 10, Formula (2)

wherein $R_3$ and $R_4$ each independently represent an ethoxy group, an alkyl group, a phenyl group, or an aralkyl group, each of which has at least one polymerizable unsaturated bond; and "n" denotes an integer of from 1 to 10, and Formula (3)

wherein $R_5$ and $R_6$ each independently represents an ethoxy group, an alkyl group, a phenyl group, or an aralkyl group, each of which has at least one polymerizable unsaturated bond; and $X_1$, $X_2$, $X_3$, and $X_4$ each independently represent hydrogen (H) or fluorine (F).

11. The fine resinous molded article of claim 10, wherein $R_1$ and $R_2$ each independently represent an alkyl group, a phenyl group, or an aralkyl group, each of which has at least one polymerizable unsaturated bond.

12. The fine resinous molded article of claim 11, further comprising a substrate, wherein the fine structures and the resinous film connecting the fine structures are provided on the substrate.

13. The fine resinous molded article of claim 11, wherein material of which the fine structures and the resinous film are made further contains an unsaturated ester compound.

14. The fine resinous molded article of claim 11, wherein material of which the fine structures and the resinous film are made further contains a compound having a vinyl group.

15. The fine resinous molded article of claim 11, wherein the at least one polymerizable organic fluorocompound is selected from the group consisting of 2,2,3,3,4,4-hexafluoro-1,5-pentyl dimethacrylate, 2,2,3,3,4,4-hexafluoro-1,5-pentyl diacrylate, 2,2,3,3,4,4,5,5-octafluoro-1,6-hexyl dimethacrylate, 2,2,3,3,4,4,5,5-octafluoro-1,6-hexyl diacrylate, 2,3,5,6-tetrafluoro-p-xylene-α-α'-diol diacrylate, 2,3,5,6-tetrafluoro-p-xylene-α-α'-diol dimethacrylate, 1,4-bis(acryloxyethoxy)-2,3,5,6-tetrafluorobenzene, 1,4-bis(methacryloxyethoxy)-2,3,5,6-tetrafluorobenzene, 1,4-bis(acryloxyethoxy)perfluorocyclohexylene, 1,4-bis(methacryloxyethoxy)perfluorocyclohexylene, 1,4-perfluorocyclohexylenebisphenol diacrylate, and 1,4-perfluorocyclohexylenebisphenol dimethacrylate.

16. The fine resinous molded article of claim 11, wherein the molded article contains 0.1 percent by weight or more of at least one of the photopolymerizable organic fluorocompounds of Formulae (1) to (3).

17. The fine resinous molded article of claim 11, wherein the organic fluorocompound comprises 0.5 to 20 percent by weight of the molded article.

18. The fine resinous molded article of claim 11, wherein the organic fluorocompound comprises 1 to 10 percent by weight of the molded article.

* * * * *